(12) United States Patent (10) Patent No.: US 6,772,356 B1
Qureshi et al. (45) Date of Patent: Aug. 3, 2004

(54) SYSTEM FOR SPECIFYING CORE VOLTAGE FOR A MICROPROCESSOR BY SELECTIVELY OUTPUTTING ONE OF A FIRST, FIXED AND A SECOND, VARIABLE VOLTAGE CONTROL SETTINGS FROM THE MICROPROCESSOR

(75) Inventors: Qadeer Ahmad Qureshi, Round Rock, TX (US); Charles Weldon Mitchell, Austin, TX (US); James John Casto, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 577 days.

(21) Appl. No.: 09/603,511

(22) Filed: Jun. 26, 2000

Related U.S. Application Data
(60) Provisional application No. 60/194,743, filed on Apr. 5, 2000.

(51) Int. Cl.[7] ............................. G06F 1/26; G06F 1/32
(52) U.S. Cl. .................... 713/321; 713/310; 713/320
(58) Field of Search ................................. 713/300, 310, 713/320, 321; 327/141–145; 326/37; 363/73, 74; 323/304, 307

(56) References Cited

U.S. PATENT DOCUMENTS

| | | | |
|---|---|---|---|
| 4,258,310 A | 3/1981 | Asakawa et al. | |
| 5,103,166 A | 4/1992 | Jeon et al. | 324/158 |

(List continued on next page.)

FOREIGN PATENT DOCUMENTS

| | | |
|---|---|---|
| DE | 19743271 C1 | 10/1998 |
| EP | 0 539 884 A1 | 5/1993 |
| EP | 0 632 360 A1 | 1/1995 |
| JP | 60010318 | 1/1985 |
| JP | 1136624 A * | 11/1999 ............. G06F/1/26 |
| WO | WO 91/00564 | 1/1991 |
| WO | WO 97/12400 | 4/1997 |

OTHER PUBLICATIONS

Pham, N.H. "On–chip Capacitor Measurement for High Performance Microprocessor," Electrical Performance of Electronic Packaging, 1998. IEEE 7th topical Meeting on, Oct. 26–28, 1998, Page(s): 65–68.*
Intel, "Intel 82371EB (PIIX4E)", Oct. 1998, pp. iii–34.
VIA Technologies, Inc. "VT82C596 'Mobile South' South Bridge", Revision 0.4, Feb. 17, 1998, pp. 1–79.
AMD Athlon™ Preliminary Information "Processor Data Sheet", Publication #21016, Rev: F, Issue Date Oct. 1999, p. 25.
PowerPC™ "Processor and Cache Module Hardware Specifications", MPCPCMEC/D (Motorola Order Number), Motorola, Inc., Aug. 1997, pp. 1–19.
U.S. patent application entitled "Integrated Circuit Package Incorporating Programmable Elements", filed Jan. 18, 2000, by James John Casto et al. (now Application No. 09/484, 311).

(List continued on next page.)

Primary Examiner—Thomas Lee
Assistant Examiner—Thuan Du
(74) Attorney, Agent, or Firm—Zagorin, O'Brien & Graham, LLP

(57) ABSTRACT

A core voltage for a core logic region of an integrated circuit is specified by a programmable register on the integrated circuit. Output terminals on the integrated circuit are coupled to the programmable storage location and supply voltage control signals for a voltage regulator to specify the core voltage according to the contents of the programmable register. The output terminals may output a programmable voltage setting or a fixed voltage setting that specifies a default core voltage value, depending on reset conditions.

36 Claims, 4 Drawing Sheets

U.S. PATENT DOCUMENTS

| | | | |
|---|---|---|---|
| 5,266,829 A | 11/1993 | Hamdy et al. | |
| 5,311,053 A | 5/1994 | Law et al. | |
| 5,627,412 A | 5/1997 | Beard | |
| 5,727,208 A | 3/1998 | Brown | 395/653 |
| 5,745,375 A | 4/1998 | Reinhardt et al. | 364/492 |
| 5,747,779 A | 5/1998 | Asanasavest | 219/603 |
| 5,748,031 A | 5/1998 | Best | |
| 5,764,529 A | 6/1998 | Capps, Jr. et al. | |
| 5,778,237 A | 7/1998 | Yamamoto et al. | |
| 5,787,014 A * | 7/1998 | Hall et al. | 323/312 |
| 5,812,860 A | 9/1998 | Horden et al. | 395/750.04 |
| 5,825,674 A | 10/1998 | Jackson | |
| 5,852,737 A | 12/1998 | Bikowsky | 395/750.05 |
| 5,873,000 A | 2/1999 | Lin et al. | 395/892 |
| 5,884,049 A | 3/1999 | Atkinson | 395/281 |
| 5,887,179 A | 3/1999 | Halahmi et al. | 395/750.06 |
| 5,958,058 A | 9/1999 | Barrus | |
| 5,968,140 A | 10/1999 | Hall | |
| 5,974,556 A | 10/1999 | Jackson et al. | |
| 5,998,853 A | 12/1999 | Sugasawara | 257/529 |
| 6,078,319 A * | 6/2000 | Bril et al. | 345/211 |
| 6,094,367 A * | 7/2000 | Hsu et al. | 363/78 |
| 6,119,241 A | 9/2000 | Michail et al. | |
| 6,141,762 A * | 10/2000 | Nicol et al. | 713/300 |
| 6,157,247 A | 12/2000 | Abdesselem et al. | |
| 6,166,985 A | 12/2000 | McDaniel et al. | |
| 6,229,378 B1 * | 5/2001 | Gourley et al. | 327/525 |
| 6,266,776 B1 | 7/2001 | Sakai | |
| 6,272,642 B2 | 8/2001 | Pole, II et al. | |
| 6,304,823 B1 | 10/2001 | Smit et al. | |
| 6,308,278 B1 | 10/2001 | Khouli et al. | |
| 6,369,437 B1 | 4/2002 | MacPherson et al. | |
| 6,384,628 B1 * | 5/2002 | Lacey et al. | 326/41 |
| 6,446,212 B1 * | 9/2002 | Smit et al. | 713/300 |
| 6,453,421 B1 * | 9/2002 | Taylor | 713/30 |

OTHER PUBLICATIONS

Intel Microsoft Toshiba, "Advanced Configuration and power Interface Specification", Revision 1.0b, Feb. 2, 1999, pp. 1–329.

Intel, "Suspend/Resume and Power Plane Control", http://developer.intel.com/design/intarch/techinfo/430TX/pwrsus-.htm, Apr. 13, 1999, pp. 1–29.

* cited by examiner

SYSTEM FOR SPECIFYING CORE VOLTAGE FOR A MICROPROCESSOR BY SELECTIVELY OUTPUTTING ONE OF A FIRST, FIXED AND A SECOND, VARIABLE VOLTAGE CONTROL SETTINGS FROM THE MICROPROCESSOR

CROSS REFERENCE TO RELATED APPLICATIONS

This application claims the benefit of U.S. Provisional Application No. 60/194,743, filed Apr. 5, 2000.

BACKGROUND OF THE INVENTION

1. Field of the Invention

The invention relates to integrated circuits and more particularly to controlling the voltage supplied to an integrated circuit.

2. Description of the Related Art

Integrated circuits such as microprocessors can be run at different clocks speeds and with different supply voltages. The determination of an appropriate clock speed and appropriate voltage for a particular microprocessor depends on many factors. For example, while higher clock speeds are generally desirable, a higher clock speed requires a higher supply voltage, which results in additional power consumption and additional heat, which needs to be dissipated. Microprocessors utilized in mobile applications are particularly sensitive to power dissipation and generally require the lowest power dissipation and thus require the lowest supply voltage that can achieve the rated clock speed. However, microprocessors used in desktop applications are less sensitive to power dissipation considerations.

In general, microprocessor product yield, performance (MHz) and reliability are affected by the voltage supply setting. Within a range of only several hundred milli-volts, dramatic differences can be seen in yield, performance and reliability, even from the same wafer lot. Choosing the best voltage is usually a compromise of yield, performance and reliability since the same value of voltage is usually chosen for a large population. Once that voltage is chosen, the voltage has to be supplied to the microprocessor when it is in the system.

Referring to FIG. 1, one prior art approach for providing the appropriate voltage and frequency values in a computer system is illustrated. Central processing unit (CPU) 101 receives core voltage 105 (commonly referred to in x86 architectures as Vcc2) from CPU core voltage regulator 107. Other voltages, which are typically supplied to the CPU, e.g., Vcc3 (I/O voltage) are not shown. Core voltage regulator 107 is programmable and receives voltage control inputs 109 (also referred to as voltage ID (VID) signals), which determine the voltage level supplied to CPU 101. CPU 101 also receives bus frequency signals 103 (BF[2:0]), which provide a multiplier used by the processor to multiply a bus clock (not shown). The multiplied bus clock is used by the CPU to clock its internal logic. The values for the both the VID signals and the BF pins are provided by the settings of jumpers 111.

A higher percentage of a given population of microprocessors could operate at higher performance levels (thus creating higher revenue) if each microprocessor could operate at its own specific voltage. One solution would be to mark each processor with a number or symbol indicating its voltage and/or speed rating. It is conceivable to set the jumpers shown in FIG. 1 to correspond to the marking (number or symbol) on the processor that indicates its voltage and/or speed rating. However, that approach provides no guarantee that appropriate voltage and frequency settings will be utilized. In fact, certain unscrupulous suppliers of computer systems have been known to provide systems having higher than recommended voltages and frequencies. Since companies typically qualify chips at certain voltage and frequencies, such over clocking or excessive voltage can result in shorter product lifetimes, decreased reliability and excessive product returns.

Providing information to users, which specifies the correct voltage and hoping that the correct voltage is subsequently supplied to the processor by circuitry on the board, as illustrated in FIG. 1, is subject both to intentional misuse and unintentional mistake. In addition, the more possible voltage settings that exist, the greater the possibility for error.

In many systems, it may be desirable to change the core voltage of the processor (e.g. when the processor is operating at low frequencies) to lower the power consumed by the processor. In such a system, the core voltage is increased to the appropriate maximum level when the core frequency is maximized. The appropriate maximum voltage level may be the lowest voltage that can adequately support the maximum frequency. However, that maximum core voltage may differ among processors even in the same frequency bin. That is, one processor may operate at maximum frequency, e.g., 500 MHz, with a voltage of 1.6V while another requires 1.8V. It would be advantageous if both processors could operate at their maximum frequency with their respective voltages, both from a power savings perspective and a reliability perspective. But there is no easy mechanism in place for software to determine the appropriate core voltage corresponding to a maximum frequency rating for a specific processor.

Thus, it would be desirable to be able to specify a core voltage for a specific processor corresponding to a maximum speed rating that can readily be utilized in a system. It would also be desirable to specify an appropriate voltage for an individual processor and still have the flexibility to change the core voltage to a higher or lower voltage corresponding to different frequencies to obtain power savings.

SUMMARY OF THE INVENTION

Accordingly, the invention provides in one embodiment an integrated circuit that has a core logic region. A programmable storage location stores at least one of a first and a second voltage control setting, respectively indicating a first and second voltage level of a core voltage supplied to the core logic region. The first voltage control setting is a fixed value and the second voltage control value is software programmable. A plurality of output terminals are coupled to the programmable storage location for outputting voltage control signals for a voltage regulator according to a value of a selected one of the first and second voltage control settings.

In another embodiment the invention provides a method of providing voltage control signals for an integrated circuit. The method includes storing a first voltage control value into a programmable storage location in the integrated circuit. The first voltage control value specifies a core voltage to be supplied to a core logic region of the integrated circuit. The first voltage control value is supplied to output terminals of the integrated circuit. The method may also include storing a second voltage control value in the programmable storage location and supplying the second voltage control value to the output terminals of the integrated circuit. The core logic region receives the core logic voltage at a second voltage level corresponding to the second voltage control value.

In still another embodiment, the invention provides an integrated circuit that includes a plurality of programmable elements such as fuses or jumpers and a programmable storage location coupled to the programmable elements. The programmable storage location is powered by a first voltage supplied to an input/output region of the integrated circuit. A core logic region of the integrated circuit receives a second supply voltage. A plurality of output terminals couple to the programmable storage location and supply voltage control values for the core logic region according to contents of the programmable storage location.

BRIEF DESCRIPTION OF THE DRAWINGS

The present invention may be better understood, and its numerous objects, features, and advantages made apparent to those skilled in the art by referencing the accompanying drawings, wherein the use of the same reference symbols in different drawings indicates similar or identical items.

DESCRIPTION OF THE PREFERRED EMBODIMENT(S)

Figure 1:
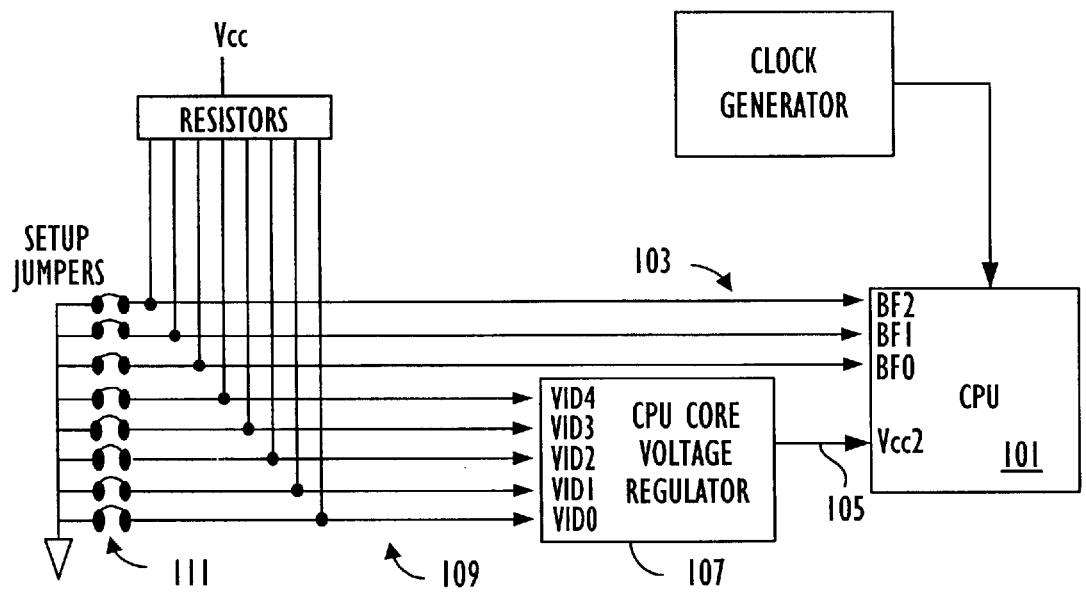
FIG. 1 shows a prior art approach for providing voltage and frequency settings in a computer system.
Figure 2:
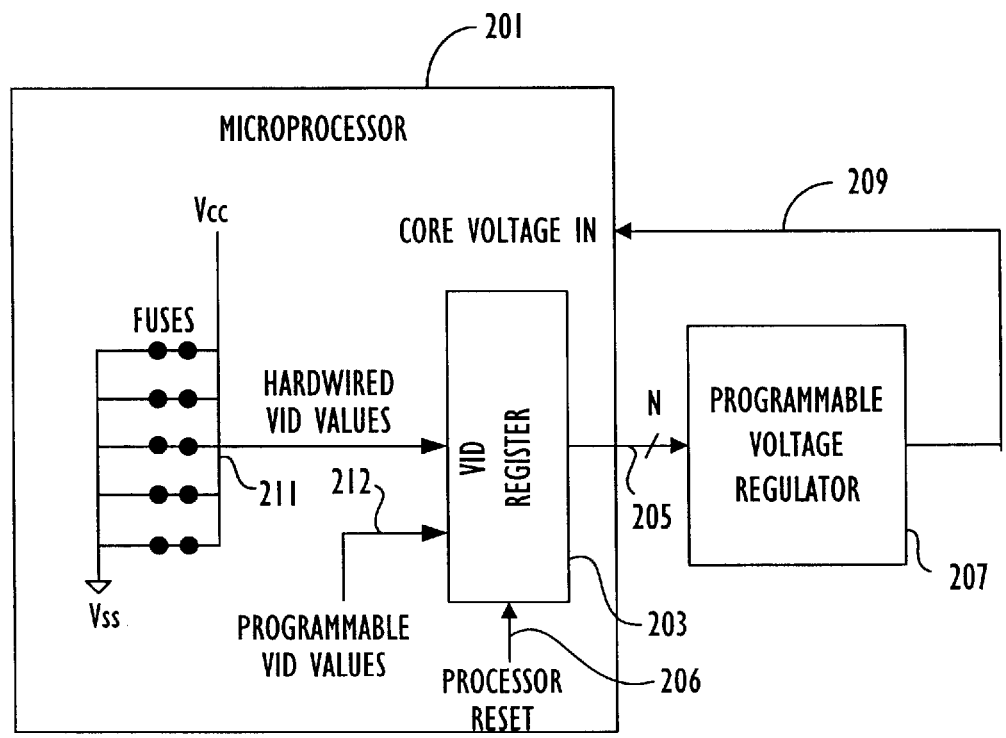
FIG. 2 illustrates an embodiment of the present invention in which a fuse array provides default VID values.

Referring to FIG. 2, an exemplary embodiment is illustrated. Microprocessor 201 includes programmable VID register 203 which supplies voltage identification (VID) values 205 to a programmable voltage regulator 207 to specify the core voltage 209 that is supplied to microprocessor 201. The programmable register receives a fixed VID value from fuse array 211.

Various configurations of fuses may be used for fuse array 211, which are described in detail in the patent application entitled, "INTEGRATED CIRCUIT PACKAGE INCORPORATING PROGRAMMABLE ELEMENTS", application Ser. No. 09/484,311, filed Jan. 18, 2000 and naming James John Casto, Qadeer Ahmad Qureshi and Hugh William Boothby as inventors, which application is incorporated herein by reference in its entirety. As described in the referenced patent application, fuse array 211 may be formed on the package of microprocessor 201 and may be formed of fuses and/or anti-fuses.

In addition to receiving the hardwired VID values from the fuse array (or other one-time programmable elements), programmable VID register 203 also receives software programmable VID values 212. In that way, the hardwired VID values can determine the voltage initially utilized by the core on power-up (or other reset condition) but the VID values can be modified later to track changes in the frequency of operation of microprocessor 201 to provide power savings, which are particularly useful battery powered applications. Thus, control logic associated with VID register 203 may utilize processor reset 206 to determine when to load the hardwired values and when to select instead the programmable VID values.

If fuses on the package provide the hardwired voltage values then several advantages may accrue. One advantage is that testing procedures to characterize the part may be completed prior to programming of the fuses. Thus, the part in question may complete tests on automatic test equipment (ATE) as well as system level tests. Once the tests are completed and the part is characterized in terms of voltage and speed, the package may be programmed without having to perform any further processing steps on the die or any further testing, except to check that the fuses were appropriately programmed. Of course, the fuses may be programmed prior to mounting the die if the values for the fuses are known.

The hardwired voltage setting or values provided by the fuse array may specify the voltage required for the highest rated frequency for the part based on the testing performed on the individual part. Even for microprocessors that can operate at the same clock frequency, the voltage needed to achieve that clock frequency may vary. Thus, the fuses may specify the minimum voltage needed to achieve a rated speed. The fuses may instead be used to provide each microprocessor with other voltage values, such as the minimum or maximum voltage that can safely be applied to the part or a default value used at power-on. The default voltage may be a maximum, a minimum or other voltage such as a minimum voltage required for a rated speed. The value set by the fuses is typically the default values utilized by the system on power-on.

Because each part may individually have its default voltage specified, the voltage parameters may be specified with more granularity. Thus, higher aggregate performance from a given population of microprocessors may be achieved by specifying the proper voltage that individual processors should receive. Additionally, some of those parts may be able to operate at lower voltages to achieve the same performance and thus consume less power. That is, the same value for voltage no longer has to be chosen for as large a population of microprocessors. Of course, the system in which the packaged part is utilized must be able to exploit any signals specified by the fuses and provided to the system.

Figure 3:
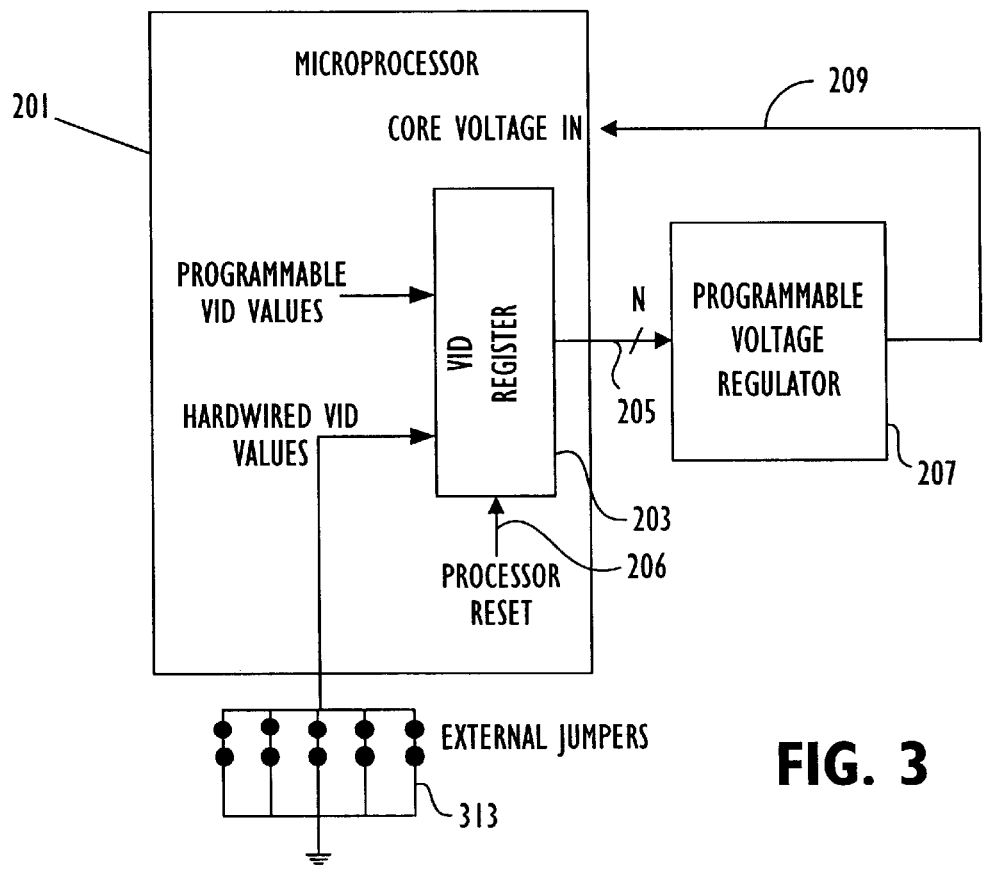
FIG. 3 illustrates an embodiment of the present invention in which external jumpers provide default VID values.

Another embodiment is shown in FIG. 3, in which programmable VID register 203 receives the hardwired VID values from external jumpers 313. That approach may not provide all the advantages of having a fuse array on the package, but it still provides the advantage of having a programmable register on the processor supplying VID values so that VID values can be changed during processor operation. Using the external fuse array 313 may also result in additional I/O terminals being used on the microprocessor.

Figure 4:
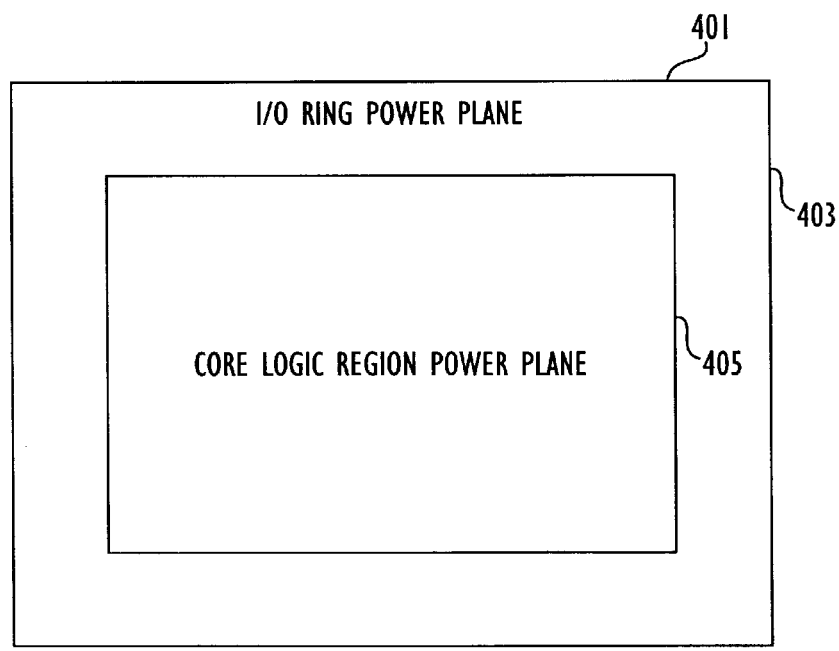
FIG. 4 illustrates several power planes of an exemplary processor that can exploit the present invention.

Referring to FIG. 4, one aspect of microprocessors is that they tend to be divided into separate power planes. FIG. 4 shows microprocessor 401 having two separate sections, an input/output (I/O) ring 403 and a core region 405 powered by separate power planes. The I/O ring portion 403 receives power from a separate power plane because certain of the external logic interfacing to processor 401 requires voltages that differ from the voltage supplied to the core voltage. Therefore the I/O logic voltage receives voltage different from the core. Further, the I/O region must maintain an interface to external logic and may not be allowed to readily adjust according to the frequency or power state of the processor core and thus needs to receive its power separately from the core logic region.

Figure 5:
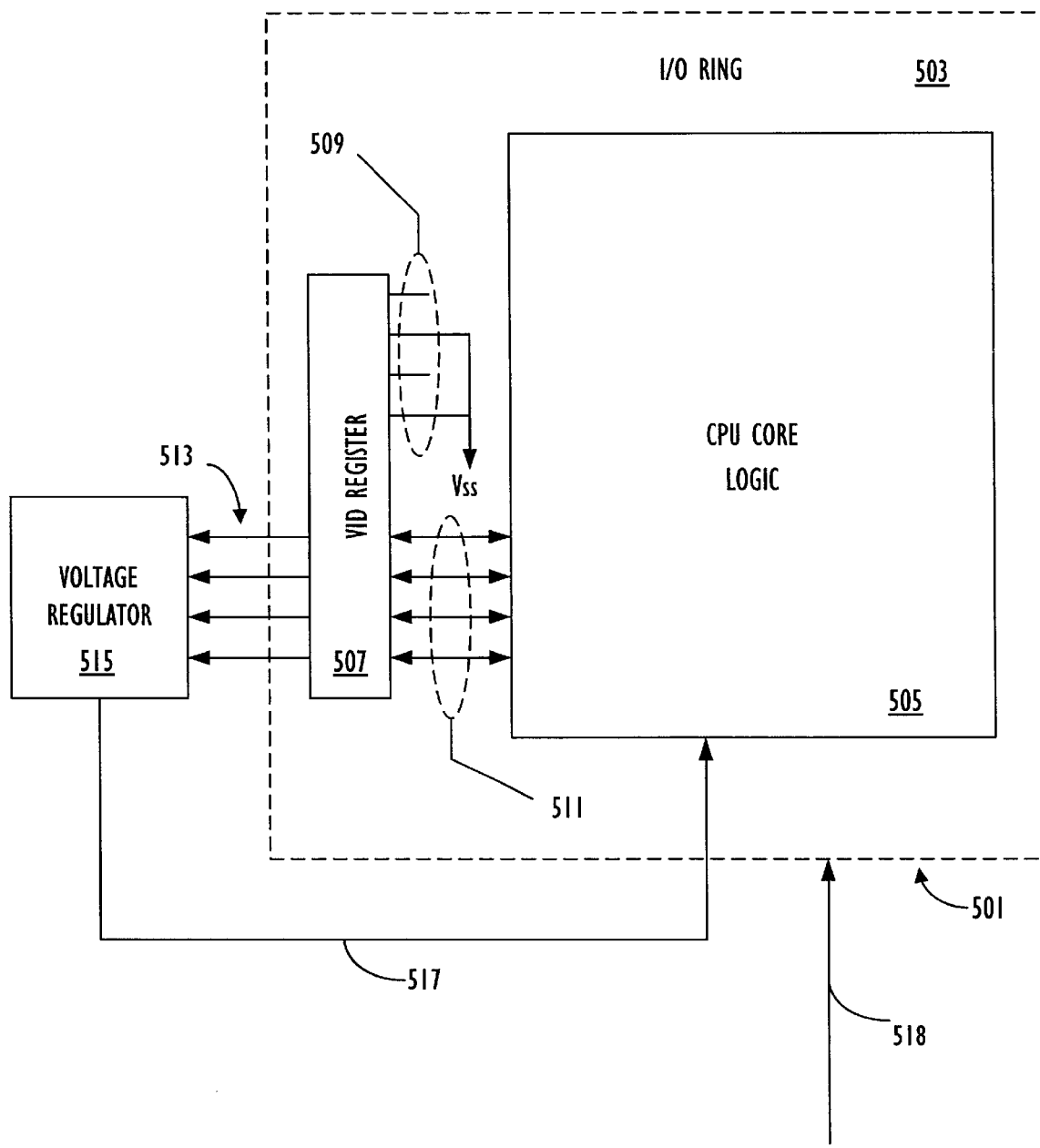
FIG. 5 shows a high level system view of one embodiment of the present invention in which the VID register is accessed by core logic.

Referring to FIG. 5, processor 501 includes VID register 507 which receives hardwired voltage control signals (VID values) 509 from one-time programmable elements (e.g., a fuse array). VID register 507 also couples to CPU core logic 505, so the core logic, once it is powered up, can read and write VID register 507 via interconnections 511. VID register 507 and associated logic to select between the fuse signals 509 and CPU core signals provided over interconnections 511, receives voltage 518 provided for the I/O ring power plane.

When the computer system is turned on, microprocessor 501 first receives I/O voltage 518 to power up I/O ring 503. That is, the I/O voltage plane receives voltage before the core logic region. When I/O voltage is applied, the hard wired voltage control inputs provided at 509 are sensed and are latched into VID register 507. At the same time, the hardwired VID values specified by the fuses (or other programmable elements) are driven to the VID output terminals to provide VID signals 513. The VID signals 513 are used by voltage regulator 515 to determine the correct core voltage 517 to supply to CPU core 505.

After the core logic is powered up, VID register 507 may be written under software control to adjust the core voltage based on the needs of the system. For example, when the frequency of processor 501 is reduced, the core voltage can be reduced to effect more power savings. Alternatively, when entering a mode where high performance is desired, the core voltage can be increased to match the increased frequency. Further details on achieving power savings by varying voltage and frequency of the microprocessor is described in application Ser. No. 09/477,141, entitled "DYNAMICALLY ADJUSTING A PROCESSOR'S OPERATIONAL PARAMETERS ACCORDING TO ITS ENVIRONMENT", naming Gary Baum, Kyle Odiorne, Charles Weldon Mitchell, Qadeer Ahmad Qureshi, and Dervinn Deyual Caldwell as inventors, filed Jan. 3, 2000, which application is incorporated herein by reference in its entirety.

In FIG. 5, the fuse array 509 is shown at an exemplary value of 1010 with the 0 values being connected to Vss and the 1 values being connected to a pull up circuit (not shown). Table 1 shows exemplary VID values which may be programmed by the VID circuit shown herein. The particular voltage values specified by the VID values depend on the desired voltage range for the processor and the granularity provided for specifying output voltages for the programmable voltage regulator.

TABLE 1

| VID Value | Voltage Value |
|---|---|
| 0011 | 1.90 V |
| 0100 | 1.85 V |
| 0101 | 1.80 V |
| 0110 | 1.75 V |
| 0111 | 1.70 V |
| 1000 | 1.65 V |
| 1001 | 1.60 V |
| 1010 | 1.55 V |
| 1011 | 1.50 V |
| 1100 | 1.45 V |

Figure 6:
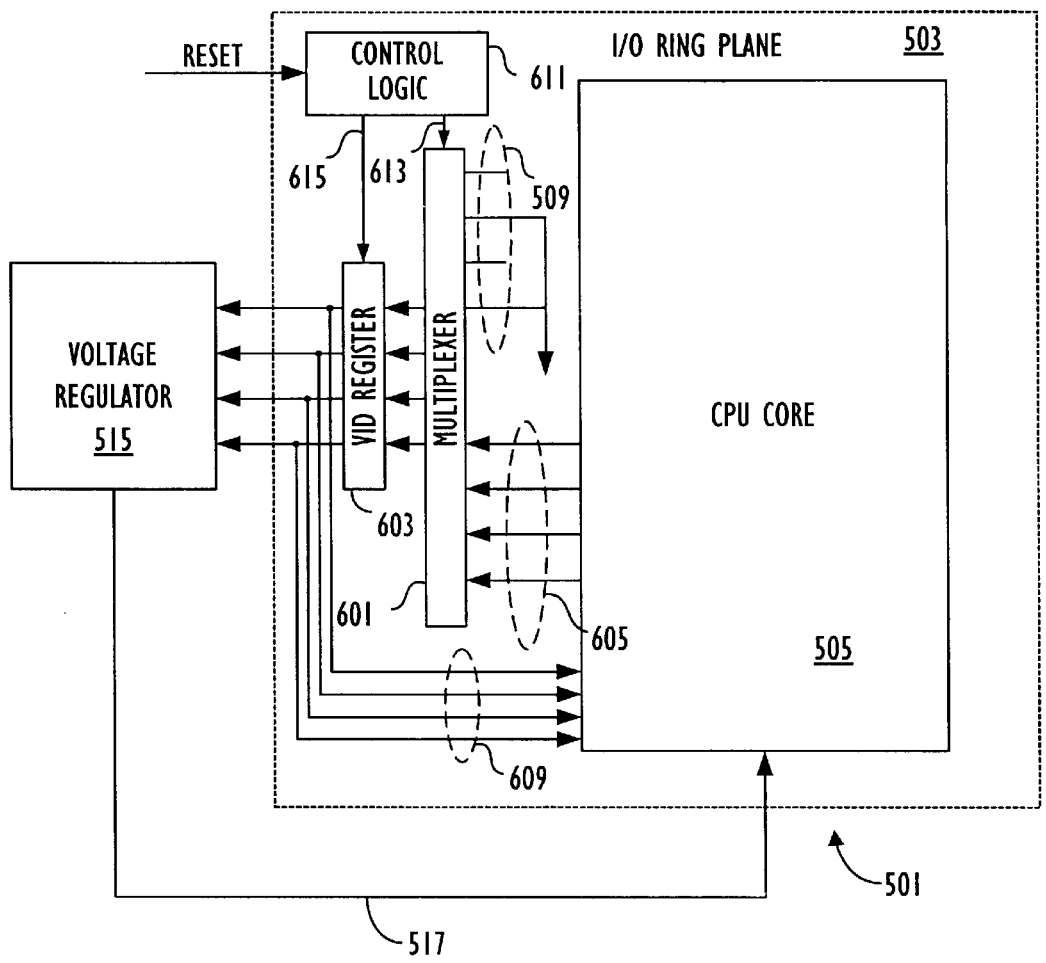
FIG. 6 illustrates additional details of one embodiment of the invention.

FIG. 6, illustrates in greater detail the select logic (including control logic 611 and multiplexer 601), which may be used in one embodiment of the invention to selectably load the hardwired or programmable VID values into VID register 603. Multiplexer 601 selects between the hardwired voltage control signals 509 and programmable voltage control signals 605 supplied from CPU core 505 according to select signal 613 supplied by control logic 611. VID register 603 can be read by core logic 505 signal lines 609. During a power on reset (or in other reset conditions), multiplexer 601 selects the hardwired voltage control signals 509, which provide the default voltage control values. At other times the multiplexer selects programmable voltage control signals 605. Control logic 611 controls loading VID register 603 via load line 615. The VID register 603 is loaded during a power-on reset and whenever updated and valid information is available from core logic region 605.

Figure 7:
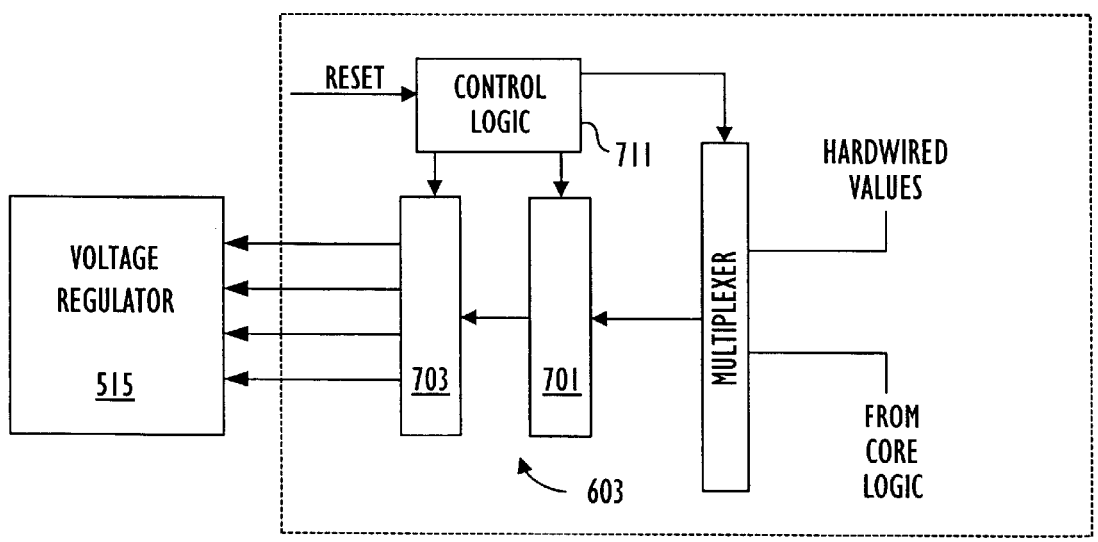
FIG. 7 illustrates an embodiment of the invention utilizing a double buffer for the VID register.

Register 603 may implemented as double buffered register as shown in FIG. 7, to ensure that the register may be written without affecting the core voltage until such time as it is appropriate. Thus, for example, buffer 701 may be loaded with a new voltage control value that corresponds to a decreased clock frequency. However, if reduced voltage is applied to core logic 505 prior to the clock frequency being reduced, that can result in unpredictable operations in the core. Accordingly, the reduced voltage should be loaded into buffer 703 and applied to voltage regulator 515 only after it is safe, e.g., after the core clocks are stopped. Thus, control logic 711 may be responsive to an indication that the core clocks are stopped, or some other control signal to load buffer 703. During reset, buffers 701 and 703 may be loaded immediately with the hardwired values from the fuse array.

While FIG. 6 shows the VID register 603 being written from the core logic 505, in other implementations, VID register 603 may be writable from interface logic that is entirely powered by the I/O power plane. In that case, the VID register could be written while the core logic remained asleep. For example, while the core logic is in a sleep state (the core power is off) a bus could pass a message with new VID values specifying the core voltage to be applied on the resume from sleep state. That requires that the bus interface logic that passes the message to the VID register, be supplied by a power plane that is not powered down during the sleep state and also assumes that the VID register is accessible to that logic.

It is advantageous to change core clock frequency and core voltage at the same time to optimize power consumption for a given frequency of operation. In order to change core clock frequency and core voltage, the core clocks are typically stopped so changes in frequency and voltage do not adversely affect the core logic. In one approach, one or more registers on a processor may be written with a new core clock frequency value, a new core voltage value and a counter value indicating how long the processor should wait before starting the core clocks after they are stopped. A write to one of the core clock frequency, core clock voltage or counter registers (or another processor register) may be used as an indication to stop core clocks, update core frequency and voltage according to the values of the registers, and restart core clocks with the new frequency after a time period determined according to the counter value. In that way, a new core clock frequency and new core voltage corresponding to the new core frequency may be supplied to the processor core.

One aspect of providing a programmable voltage control register on a microprocessor is that it may be important to restrict access to the register. Therefore, in order to prevent errant or malicious software from accidentally or intentionally changing core voltage, various protection schemes may be employed. For example, in one approach, the operating system (OS) may restrict access to the VID register to software operating at an appropriate privilege level. In that way, the operating system can keep an application program that has malfunctioned or a malicious program from potentially damaging the processor or rendering it inoperable by changing the core voltage to a range outside of safe operational limits.

In another approach, hardware checks may be utilized to ensure that any value written into the VID register is within an acceptable range of voltages, i.e., within operationally safe and/or acceptable values. That can be done by comparing the value to be written to the VID register to a maximum voltage value, to ensure an overvoltage is not going to be applied. In addition, checks can also be made to ensure that the voltage value is above a minimum voltage value. The VID register would then only be loaded if the value to be written to the VID register is below the maximum voltage or within the appropriate range (depending on the exact check performed). The appropriate maximum value may in fact be the voltage specified by the hardwired logic. Appropriate voltage ranges may be provided by the operating system or the BIOS when the system is initialized. If the voltage is not within an acceptable range or above or below appropriate operational levels, the compare logic may cause the default voltage setting to be selected instead.

Note that the embodiment shown in FIGS. 2–7 are exemplary. Many equivalent logic circuits would be readily apparent to those of skill in the art to provide the functionality described herein. For example, in FIG. 6, control logic 611 may reside in substantial part in the core logic region although sufficient logic has to reside in I/O ring 503 to ensure that at power up, when I/O voltage is first applied, multiplexer 601 selects the hardwired values 509 and stores those values in VID register 603 so that core logic region 505 receives the correct core voltage 517 during the power up sequence. In another embodiment, multiplexer 601 may connect directly to output terminals and select between the output of the VID register and the hardwired values.

The description of the invention set forth herein is illustrative, and is not intended to limit the scope of the invention as set forth in the following claims. Variations and modifications of the embodiments disclosed herein, may be made based on the description set forth herein, without departing from the scope and spirit of the invention as set forth in the following claims.

What is claimed is:

1. An integrated circuit comprising:
   a core logic region of the integrated circuit;
   a programmable storage location coupled to at least one of a first and a second voltage control setting, respectively indicating a first and second voltage level of a core voltage supplied to the corp logic region of the integrated circuit, the first voltage control setting being a fixed value and the second voltage control setting being programmable, the first and second voltage levels corresponding to a frequency of operation for the core logic region; and
   a plurality of output terminals coupled to the programmable storage location for outputting voltage control signals for a voltage regulator according to a value of a selected one of the first and second voltage control settings.

2. The integrated circuit as recited in claim 1 wherein the first voltage control setting is coupled to the output terminals through a selection circuit.

3. The integrated circuit as recited in claim 1 wherein the first and second voltage control settings are coupled to the programmable storage location through a selection circuit.

4. The integrated circuit as recited in claim 1 wherein the first voltage control setting is determined by one-time programmable elements.

5. The integrated circuit as recited in claim 4 wherein the one-time programmable elements include fuses.

6. The integrated circuit as recited in claim 1 wherein the plurality of output terminals output the voltage control signals with values determined according to the first voltage control setting, when a reset is active.

7. The integrated circuit as recited in claim 1 wherein the integrated circuit includes a central processing unit (CPU).

8. The integrated circuit as recited in claim 1 further comprising:
   an input/output (I/O) region of the integrated circuit, wherein a first voltage is supplied to the I/O region and a second voltage is supplied to the core logic region; and
   wherein the programmable storage location is coupled to operate using the first voltage.

9. The integrated circuit as recited in claim 8 wherein the first voltage is supplied prior to the second voltage being supplied during a power on sequence and wherein the programmable storage location stores the first voltage control setting in response to a reset condition.

10. The integrated circuit as recited in claim 1 wherein the first voltage control setting in the programmable storage location is subsequently stored in a second programmable storage location.

11. The integrated circuit as recited in claim 1 wherein the first voltage control setting indicates a core voltage corresponding to a maximum frequency of operation for the integrated circuit.

12. The integrated circuit as recited in claim 1 wherein the first voltage control setting indicates a default core voltage.

13. The integrated circuit as recited in claim 1 wherein the first voltage control setting is supplied from a jumper setting located apart from the integrated circuit.

14. The integrated circuit as recited in claim 1 wherein the second voltage control setting is received from the core logic.

15. The integrated circuit as recited in claim 1 wherein the second voltage control setting is received from logic outside of the core logic.

16. A microprocessor comprising:
   a plurality of output terminals for supplying voltage control signals;
   a programmable storage location coupled to the output terminals and storing values for the voltage control signals, which specify a level for a voltage supplied to a core logic region of the microprocessor, the level corresponding to a frequency of operation for the core logic region of the microprocessor; and
   wherein the output terminals are coupled to selectably output one of software programmable voltage control signals and fixed voltage control signals as the voltage control signals.

17. The microprocessor as recited in claim 16 further comprising select logic coupled to select one of the programmable voltage control signals and the fixed voltage control signals according to a reset condition.

18. The microprocessor as recited in claim 17 wherein the select logic selectably supplies the programmable storage location with one of the programmable voltage control signals and the fixed voltage control signals.

19. The microprocessor as recited in claim 16 wherein the fixed value is specified by one-time programmable elements on the microprocessor.

20. The microprocessor as recited in claim 16 further comprising compare logic coupled to compare at least the programmable voltage setting to a predetermined value and to selectably prevent supplying the programmable voltage setting as the voltage control signal according to the comparison.

21. The microprocessor as recited in claim 16 wherein the programmable register is located outside of the core logic region of the microprocessor.

22. A method of providing voltage control signals for an integrated circuit comprising:

storing a first voltage control value into a programmable storage location in the integrated circuit, the first voltage control value indicative of a core voltage corresponding to a frequency of operation for a core logic region of the integrated circuit and to be supplied to the core logic region of the integrated circuit;

comparing the first voltage control value to at least one predetermined value to determine if the first voltage control value is an acceptable voltage control value; and supplying the first voltage control value to output terminals of the integrated circuit according to the comparing.

23. The method as recited in claim 22 wherein the first voltage control value is determined to be acceptable if within a predetermined range specifying appropriate operational values for the core logic voltage.

24. The method as recited in claim 22 further comprising receiving into the core logic region the core logic voltage having a voltage level corresponding to the first voltage control value.

25. The method as recited in claim 22 further comprising:

storing a second voltage control value into the programmable storage location;

supplying the second voltage control value to the output terminals of the integrated circuit; and receiving into the core logic region the core logic voltage at a second voltage level corresponding to the second voltage control value.

26. The method as recited in claim 25 wherein the second voltage control value is stored when an input/output (I/O) region voltage supplied to the input/output region is applied to the integrated circuit.

27. The method as recited in claim 25 wherein the second voltage control value indicates a core voltage corresponding to a frequency of operation.

28. The method as recited in claim 25 further comprising comparing a third value to be written into the programmable storage location to the second voltage control value to determine if the third value indicates a core voltage greater than an appropriate core voltage.

29. The method as recited in claim 25 wherein the second voltage control values are hardwired.

30. The method as recited in claim 25 wherein the second voltage control values are supplied from fuses on the integrated circuit package.

31. The method as recited in claim 22 wherein the first voltage control value is stored in the programmable register after core logic voltage is supplied.

32. An integrated circuit comprising:

a plurality of programmable elements;

a programmable storage location coupled to the programmable elements and powered by a first voltage supplied to an input/output region of the integrated circuit;

a core logic region of the integrated circuit supplied with a second voltage; and a plurality of output terminals coupled to the programmable storage location to supply voltage control values specifying a level for the second voltage according to contents of the programmable storage location, the level being indicative of a core voltage corresponding to a frequency of operation for the core logic region.

33. The integrated circuit as recited in claim 32 wherein the integrated circuit includes a package and the programmable elements are fuses disposed on the package of the integrated circuit.

34. The integrated circuit as recited in claim 32 wherein the core logic region is coupled to read and write the programmable storage location.

35. The integrated circuit as recited in claim 32 wherein the programmable elements specify a voltage control value to be supplied to a voltage regulator for controlling a voltage level of the second voltage.

36. An integrated circuit comprising:

means for providing a hardwired first voltage control value;

means for providing a programmable second voltage control value; and means for selectably supplying one of the first and second voltage control values to output terminals of the integrated circuit to specify a voltage level for a core logic region of the integrated circuit, the voltage level corresponding to a frequency of operation for the core logic region of the integrated circuit.

* * * * *